(12) United States Patent
Chao

(10) Patent No.: US 7,952,889 B2
(45) Date of Patent: May 31, 2011

(54) STACKING STRUCTURE OF PRINTED CIRCUIT BOARD

(75) Inventor: Yuan-Hsiao Chao, Tu-Cheng (TW)

(73) Assignee: Chi Mei Communication Systems, Inc., Tu-Cheng, New Taipei (TW)

( * ) Notice: Subject to any disclaimer, the term of this patent is extended or adjusted under 35 U.S.C. 154(b) by 369 days.

(21) Appl. No.: 12/133,477

(22) Filed: Jun. 5, 2008

(65) Prior Publication Data
US 2009/0135576 A1 May 28, 2009

(30) Foreign Application Priority Data

Nov. 28, 2007 (CN) .......................... 2007 1 0202741

(51) Int. Cl.
*H05K 9/00* (2006.01)
(52) U.S. Cl. ........ 361/816; 361/800; 361/818; 361/753; 361/799; 174/350
(58) Field of Classification Search .................. 361/816, 361/818, 800, 753, 799; 174/350, 377
See application file for complete search history.

(56) References Cited

U.S. PATENT DOCUMENTS

| | | | | |
|---|---|---|---|---|
| 5,895,884 A * | 4/1999 | Davidson | ....................... | 174/372 |
| 6,269,008 B1 * | 7/2001 | Hsu | ............................... | 361/816 |
| 6,377,472 B1 * | 4/2002 | Fan | ............................... | 361/800 |
| 6,522,261 B2 * | 2/2003 | Scheffler et al. | ........... | 340/815.73 |
| 6,590,783 B2 * | 7/2003 | Spratte et al. | ................ | 361/800 |
| 6,949,706 B2 * | 9/2005 | West | .............................. | 174/384 |
| 7,177,161 B2 * | 2/2007 | Shima | ........................... | 361/816 |
| 7,285,732 B2 * | 10/2007 | Vinokor et al. | ............... | 174/382 |
| 7,345,248 B2 * | 3/2008 | Vinokor et al. | ............... | 174/382 |
| 7,623,360 B2 * | 11/2009 | English et al. | ................ | 361/816 |
| 7,633,768 B2 * | 12/2009 | Horng | ........................... | 361/818 |
| 7,679,935 B2 * | 3/2010 | Horng | ........................... | 361/818 |
| 7,843,705 B2 * | 11/2010 | Horng | ........................... | 361/818 |

FOREIGN PATENT DOCUMENTS

| | | |
|---|---|---|
| CN | 1327712 | 12/2001 |
| CN | 1592570 | 3/2005 |
| CN | 2887006 | 4/2007 |

\* cited by examiner

*Primary Examiner* — Dameon E Levi
(74) *Attorney, Agent, or Firm* — Steve M. Reiss

(57) ABSTRACT

A stacking structure (20) of printed circuit board is provided. The stacking structure includes a first printed circuit board (22), a second printed circuit board (24), and at least one electronic component. The first printed circuit board has a first shielding frame (262) arranged thereon, and the second printed circuit board has a second shielding frame (264) arranged thereon. The second printed circuit board is stacked on the first printed circuit board. The at least one electronic component is disposed on at least one opposite surfaces of the first and the second printed circuit board. The first shielding frame is engaged with the second shielding frame for shielding the at least one electronic element. In addition, an electronic device incorporating the stacking structure of printed circuit board (10) is also provided.

14 Claims, 6 Drawing Sheets

STACKING STRUCTURE OF PRINTED CIRCUIT BOARD

BACKGROUND OF THE INVENTION

1. Field of the Invention

The present invention relates to a stacking structure of a printed circuit board (PCB) and, particularly, to a stacking structure of a printed circuit board equipped within portable electronic devices.

2. Discussion of the Related Art

During the use of portable electronic devices, such as mobile phones, personal digital assistant (PDAs) and so on, circuit boards, conducting wires and other electronic elements arranged in the portable electronic devices radiate high-band electromagnetic wave. However, such electromagnetic wave not only interferes with the operations of the portable electronic devices, it is also harmful to the human body. In order to reduce the radiation and interference caused by the electromagnetic wave, shielding frames are usually used to shield circuit boards, conducting wires and other electronic elements so as to reduce the negative effect caused by the electromagnetic wave. However, with the development of more and more functions and the miniaturization of the electronic devices, more and more circuit boards are desired to be equipped within an electronic device simultaneously. Therefore, the stacking structure of printed circuit board is applied to satisfy such demand.

Refer to FIG. 6, a typical stacking structure of printed circuit board 10 includes a first printed circuit board 12, a second printed circuit board 14 stacked on the first printed circuit board 12, a first shielding frame 16, a second shielding frame 18, and a plurality of connectors 19. The first printed circuit board 12 includes a first surface 122 and a second surface 124 opposite to the first surface 122. The second printed circuit board 14 includes a first surface 142 and a second surface 144 opposite to the first surface 142. The first surface 122 of the first printed circuit board 12 connects to the first surface 142 of the second printed circuit board 14 via the connectors 19 so as to electrically connect the first printed circuit board 12 to the second printed circuit board 14. A first electronic element 126 is disposed on the second surface 124 of the first printed circuit board 12, and is shielded by the first shielding frame 16. A second electronic element 144 is disposed on the second surface 144 of the second printed circuit board 14, and is shielded by the second shielding frame 18.

As the connectors 19 for connecting the first printed circuit board 12 and the second printed circuit board 14 has a certain thickness, the overall thickness of the stacking structure of printed circuit board 10 is thus increased. Accordingly, such stacking structure of printed circuit board 10 is not suitable to be equipped in portable electronic devices. Meanwhile, the stacking structure of printed circuit board 10 requires two shielding frames for respectively shielding the first printed circuit board 12 and the second printed circuit board 14, and thus the cost of the stacking structure of printed circuit board 10 is relatively high.

Therefore, a new stacking structure of printed circuit board is desired in order to overcome the above-described problems.

SUMMARY OF THE INVENTION

In one aspect, a stacking structure of printed circuit board is provided. The stacking structure includes a first printed circuit board, a second printed circuit board, and at least one electronic component. The first printed circuit board has a first shielding frame arranged thereon, and the second printed circuit board has a second shielding frame arranged thereon. The second printed circuit board is stacked on the first printed circuit board. The at least one electronic component is disposed on at least one opposite surfaces of the first and the second printed circuit board. The first shielding frame is engaged with the second shielding frame for shielding the at least one electronic element.

BRIEF DESCRIPTION OF THE DRAWINGS

Many aspects of the stacking structure of printed circuit board can be better understood with reference to the following drawings. The components in the drawings are not necessarily to scale, the emphasis instead being placed upon clearly illustrating the principles of the present hinge assembly. Moreover, in the drawings, like reference numerals designate corresponding parts throughout the several views.

DETAILED DESCRIPTION OF THE EMBODIMENTS

Figure 1:
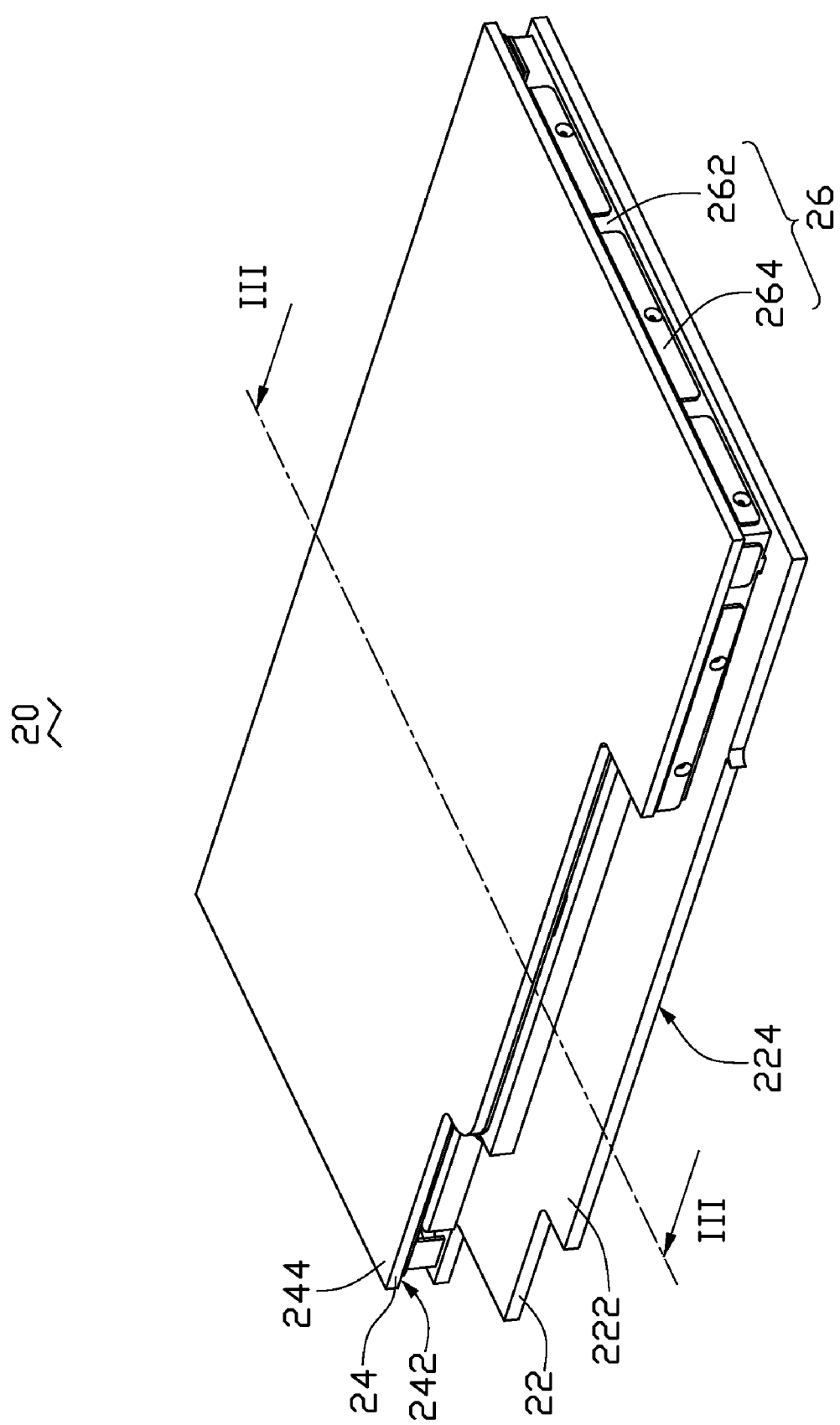
FIG. 1 is an isometric view of a stacking structure of printed circuit board according to a preferred embodiment.

Referring now to the drawings in detail, FIG. 1 shows a stacking structure of printed circuit board 20 according to a preferred embodiment. The stacking structure of printed circuit board 20 includes a first printed circuit board 22, a second printed circuit board 24, and a connecting mechanism 26. The second printed circuit board 24 is stacked on the second printed circuit board 22 via the connecting mechanism 26.

Figure 2:
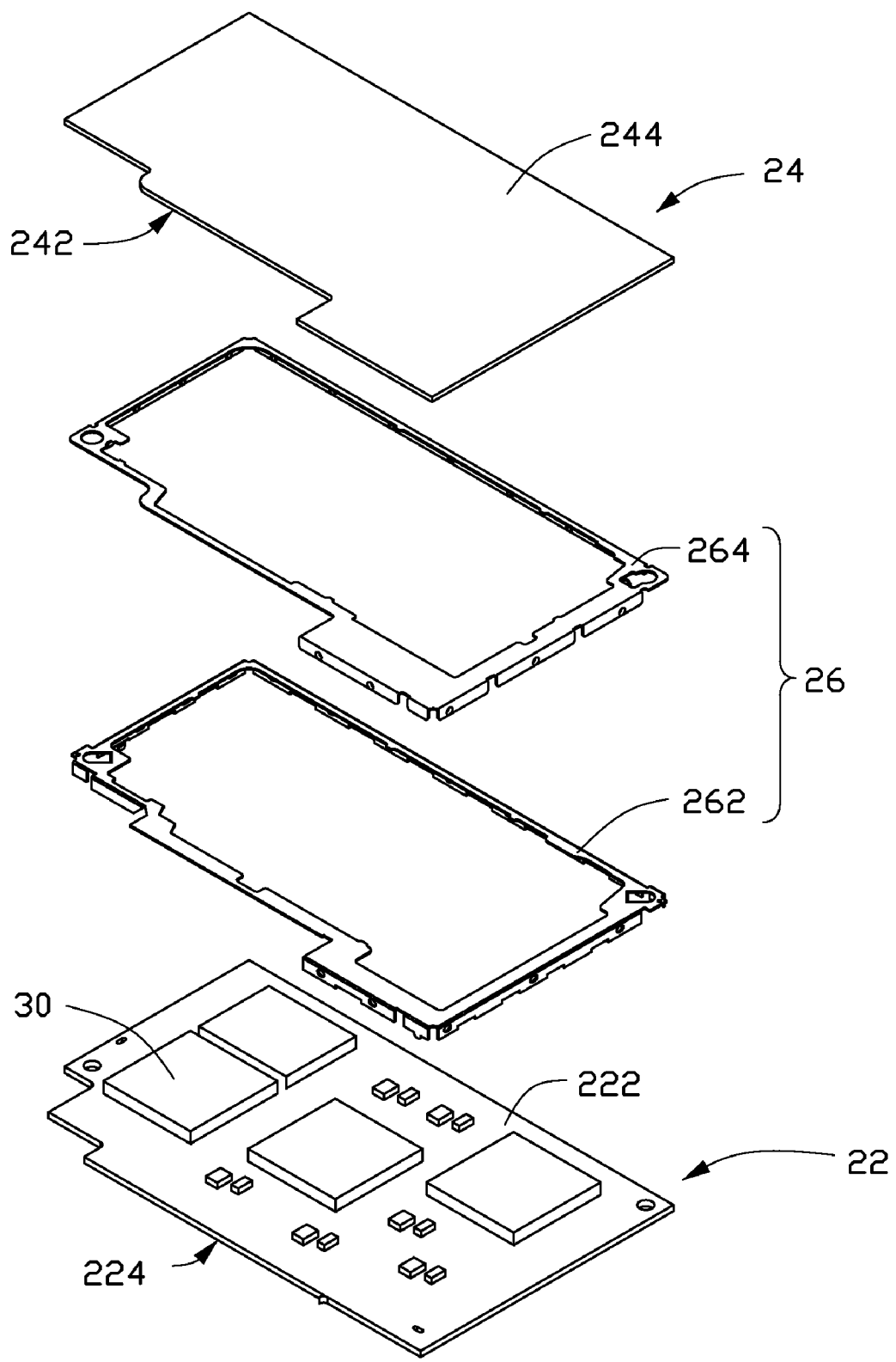
FIG. 2 is an exploded isometric view of the stacking structure of FIG. 1.

Also referring to FIG. 2, the first printed circuit board 22 includes a first surface 222 with a first electronic element 30 disposed thereon and a second surface 224 opposite to the first surface 222. The second printed circuit board 24 includes a first surface 242 facing the first printed circuit board 22 and a second surface 244 opposite to the first surface 242. The first electronic element 30 may alternatively be disposed on the first surface 242 of the second printed circuit board 24.

Figure 3:
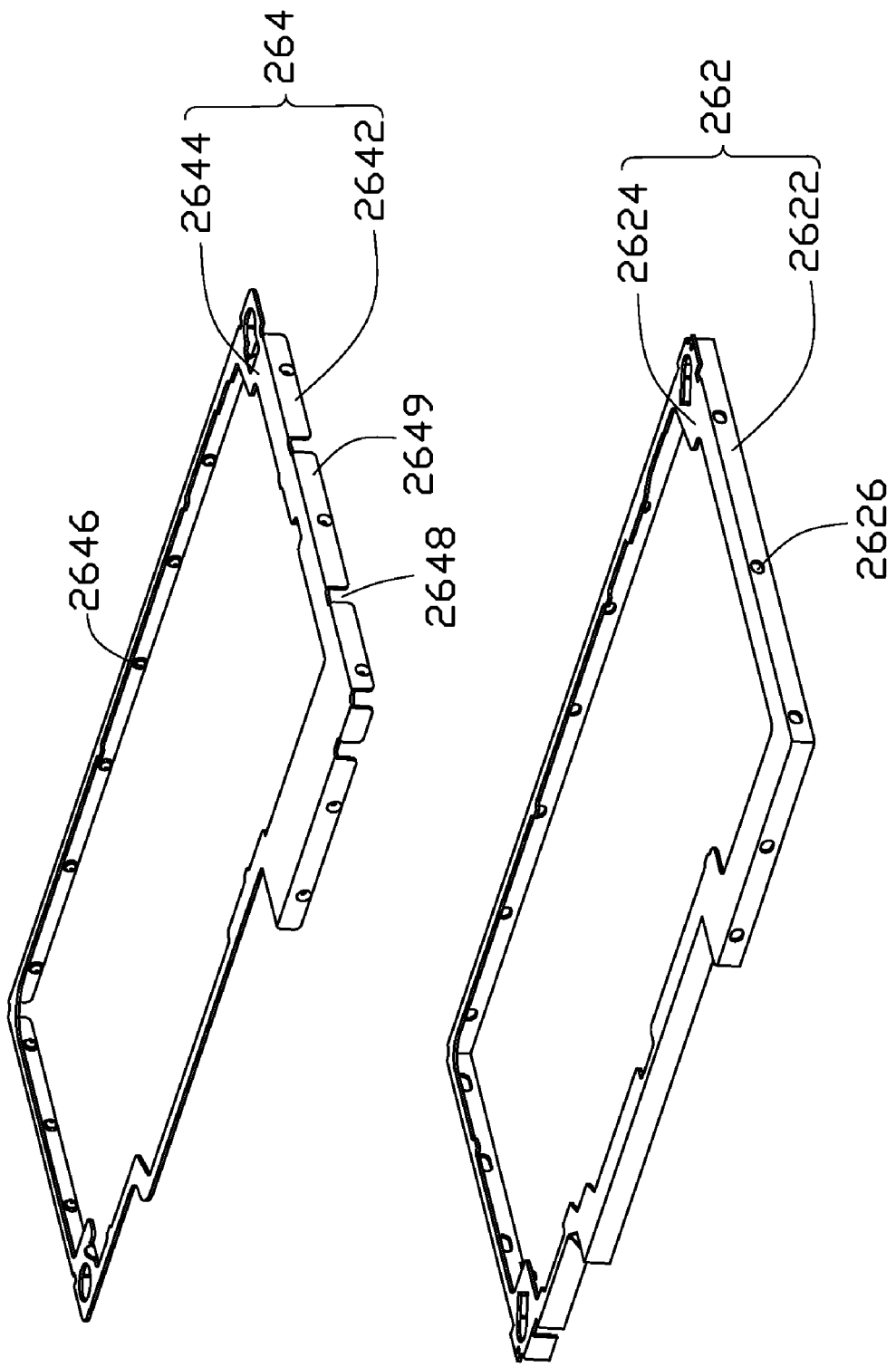
FIG. 3 is an isometric view showing the decomposed connecting mechanism of FIG. 1.

The connecting mechanism 26 includes a first shielding frame 262 and a second shielding frame 264. The first shielding frame 262 is made of metallic material and is formed on the first printed circuit board 22 via the surface mount technology (SMT) technique. Also referring to FIG. 3, the first shielding frame 262 includes a first flange 2622 and a first extending portion 2624. The first flange 2622 is for shielding the first electronic element 30 disposed on the first printed circuit board 22. The first flange 2622 defines a plurality of through holes 2626 which are substantially circular-shaped or rectangular-shaped, as well as other geometric shapes. The first extending portion 2624 extends from a top of the first flange 2622 toward internal space of the first shielding frame 262, and contributes to an improvement of the rigidity of the first flange 2622 when the first shielding frame 262 is fit and integrated to the second shielding frame 264.

The second shielding frame 264 is also made of metallic material having a shape and size substantially equivalent to that of the first shielding frame 262. The second shielding frame 264 includes a second flange 2642 and a second extending portion 2644 extending from a top of the second flange 2642 toward internal space of the second shielding frame 264. The second flange 2642 includes a plurality of projections 2646, which are corresponding to the through holes 2626 of the first shielding frame 262. In addition, the shape and the size of the projections 2646 are substantially equivalent to that of the through holes 2626. The second flange 2642 also defines a plurality of slits 2648 which divide the second flange 2642 into a plurality of sections 2649. The sections 2649 of the second shielding frame 264 may be pulled outwardly so as to conveniently integrate the second shielding frame 264 with the first shielding frame 262.

The second extending portion 2644 is for attaching the second shielding frame 264 to the second printed circuit board 24 via SMT technique. In addition, when the first shielding frame 262 is fit and integrated to the second shielding frame 264, the first extending portion 2624 is closely attached to the second extending portion 2644.

Figure 4:
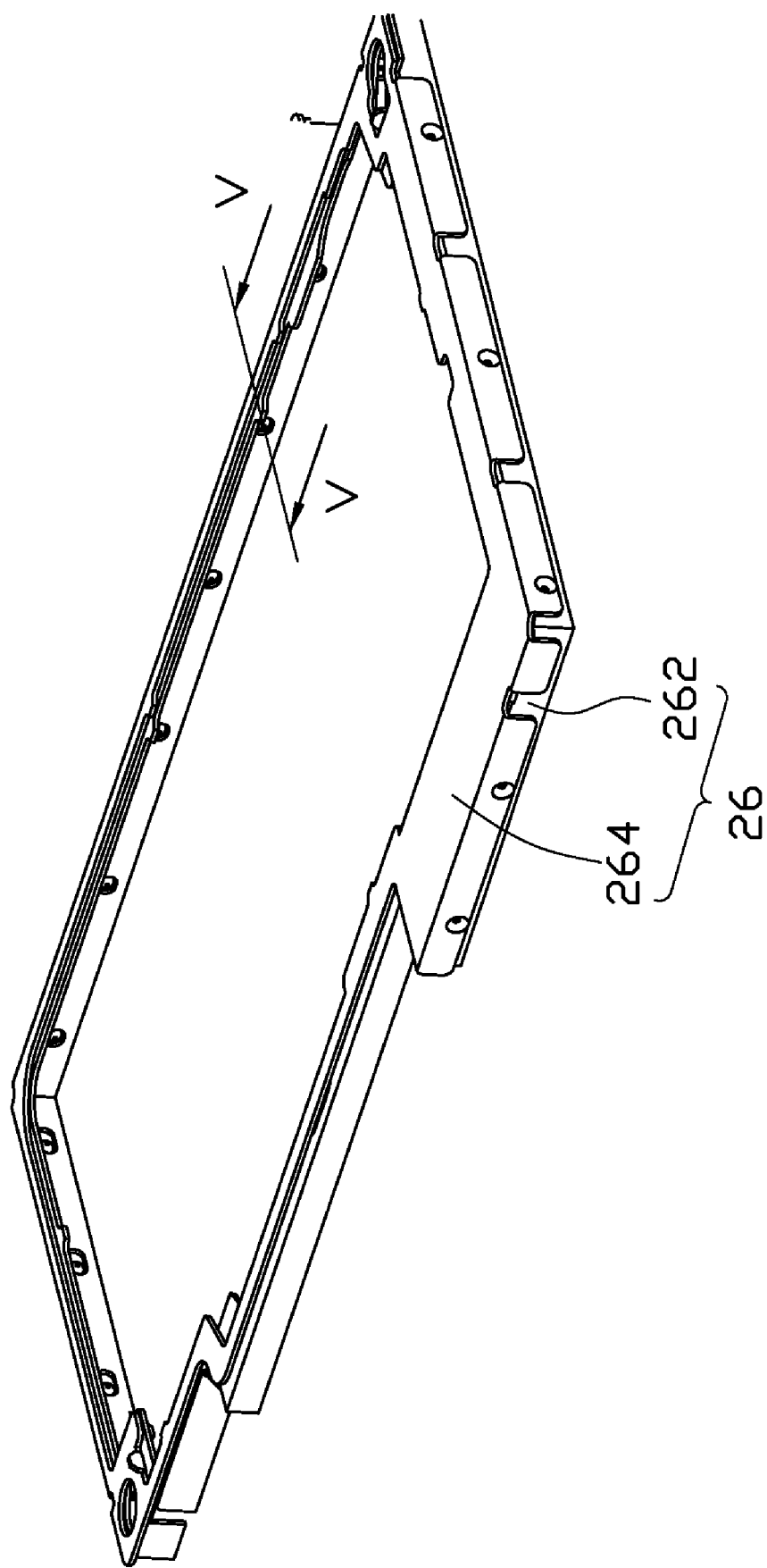
FIG. 4 is an isometric view showing the assembled connecting mechanism of FIG. 1.
Figure 5:
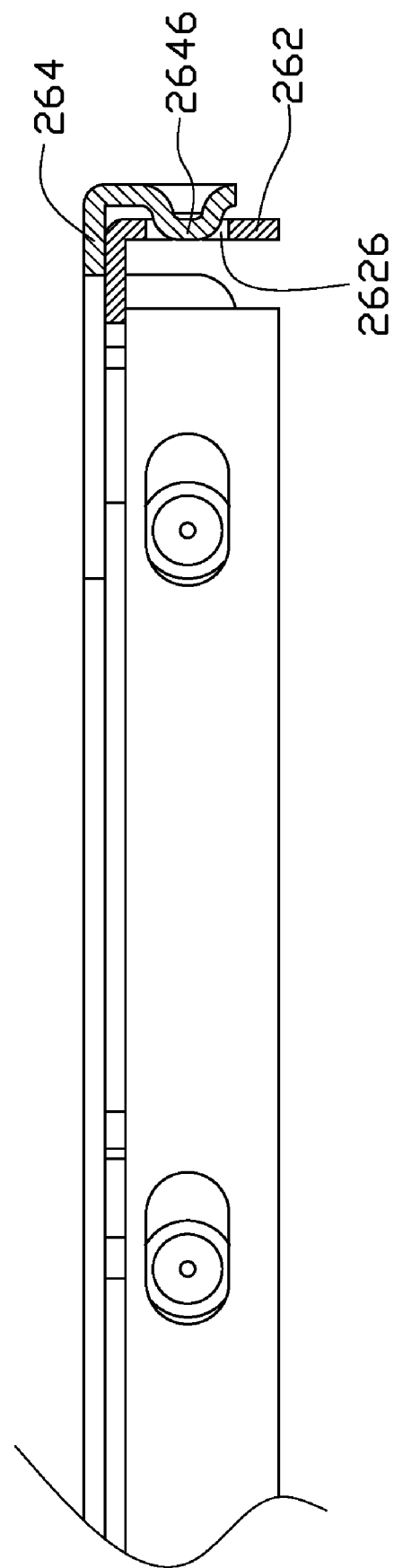
FIG. 5 is a partial-sectional view of the connecting mechanism of FIG. 4.
Figure 6:
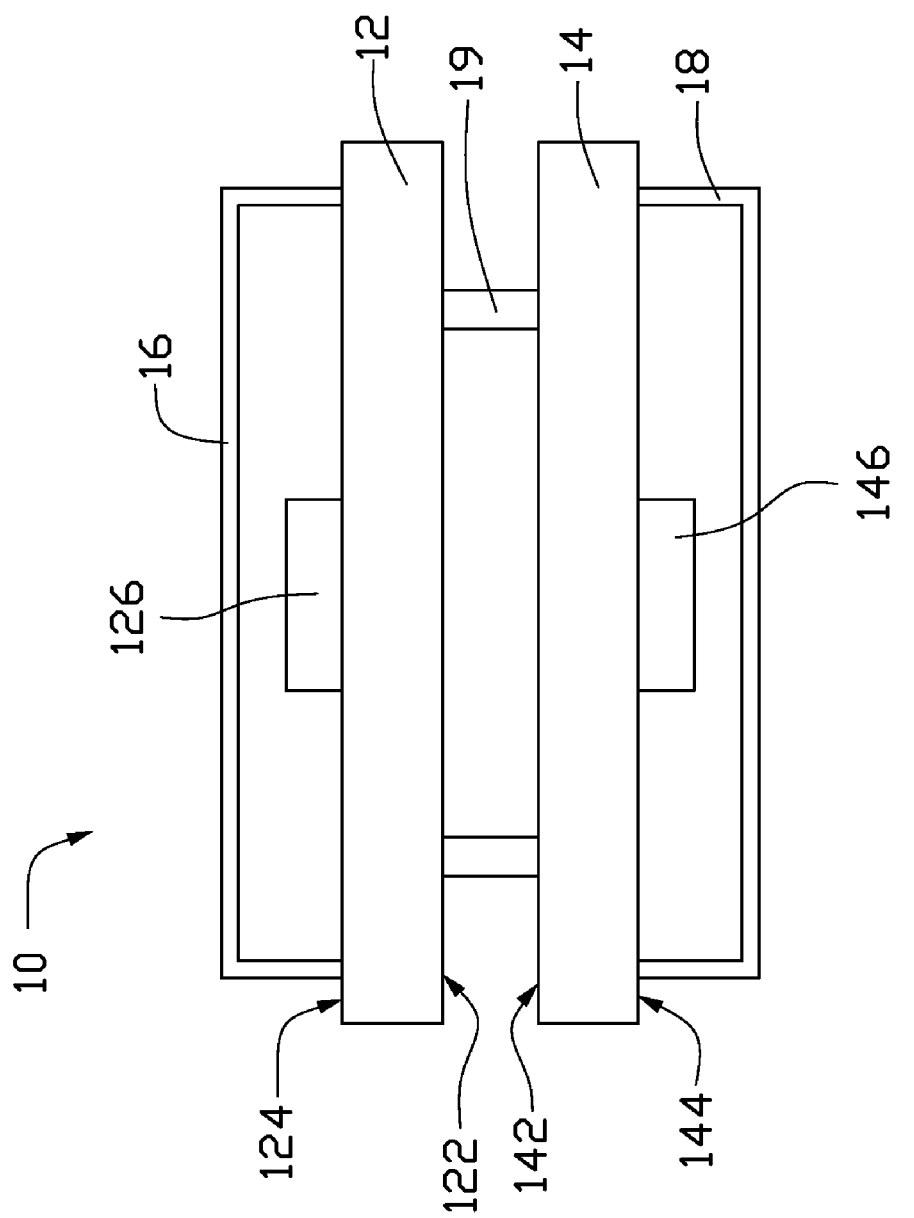
FIG. 6 is a schematic view showing a traditional stacking structure of printed circuit board.

FIGS. 4 and 5 show the assembled connecting mechanism 26. The second shielding frame 264 is mounted on the first shielding frame 262, and each of the projections 2646 is successively engaged in/with a corresponding one of the through holes 2626 so as to integrate the first shielding frame 262 to the second shielding frame 264. Understandably, the integration of the first shielding frame 262 and the second shielding frame 264 may be detached from each other by detaching the projections 2646 from the through holes 2626.

In various embodiment, additional electronic element (not shown) may alternatively be disposed on the first surface 242 of the second printed circuit board 24 as the interference caused by the electromagnetic waves between the first electronic element 30 on the first printed circuit board 22 and the additional electronic element on the second printed circuit board 24 is not sufficient enough to affect the operations between the electronic elements. In this way, the second electronic element 30 is shielded by the second shielding frame 264. That is to say, the first electronic element 30 and the additional electronic element are shielded by the space cooperatively defined by the connecting mechanism 26, the first printed circuit board 22 and the second printed circuit board 24. As a result, the cost of making the shielding frame is reduced and the overall thickness of the stacking structure of printed circuit board 20 is also reduced.

In view of the above, the first printed circuit board 22 and the second printed circuit board 24 may be stacked via the connecting mechanism 26 without additional connectors so that the overall thickness and the cost of making the stacking structure of printed circuit board 20 may be reduced. In addition, the space cooperatively defined by the connecting mechanism 26, the first printed circuit board 22 and the second printed circuit board 24 may be used to dispose more than one electronic elements. In this way, the stacking structure of printed circuit board 20 with simpler manufacturing process, lower cost, and thinner thickness may be provided.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A stacking structure of printed circuit board comprising:
a first printed circuit board having a first shielding frame arranged thereon;
a second shielding frame fit over the first shielding frame;
a second printed circuit board being mounted to the second shielding frame, the first printed circuit board and the second printed circuit board sandwiching the first shielding frame and the second shielding frame therebetween; and
at least one electronic component being disposed between the first and the second printed circuit board, and the first shielding frame detachably latched with the second shielding frame for shielding the at least one electronic element.

2. The stacking structure of printed circuit board as claimed in claim 1, wherein the first shielding frame comprises a first flange with a plurality of through holes, the second shielding frame comprises a second flange and wherein the second flange comprises a plurality of projections configured to be received in the through holes of the first shielding frame.

3. The stacking structure of printed circuit board as claimed in claim 2, wherein the second flange comprises a plurality of slits dividing the second flange into a plurality of sections.

4. The stacking structure of printed circuit board as claimed in claim 2, wherein the through holes are circular-shaped.

5. The stacking structure of printed circuit board as claimed in claim 2, wherein the first shielding frame further comprises a first extending portion extending from a top of the first flange toward internal space of the first shielding frame.

6. The stacking structure of printed circuit board as claimed in claim 2, wherein the second shielding frame further comprises a second extending portion extending from top of the second flange toward internal space of the second shielding frame for attaching the second shielding frame to the second printed circuit board.

7. The stacking structure of printed circuit board as claimed in claim 2, wherein the second printed circuit board comprises a first surface facing the first printed circuit board and a second surface opposite to the first surface, the second surface is configured for disposing electronic elements.

8. The stacking structure of printed circuit board as claimed in claim 7, wherein the stacking structure further comprises a cover mechanism for shielding the electronic elements disposed on the second surface of the second printed circuit board.

9. The stacking structure of printed circuit board as claimed in claim 8, wherein the cover mechanism comprises a shielding frame and a cover frame.

10. The stacking structure of printed circuit board as claimed in claim 9, wherein the shielding frame comprises a first flange with a plurality of through holes and a first extending portion extending from a top of the flange toward internal space of the shielding frame.

11. The stacking structure of printed circuit board as claimed in claim 10, wherein the cover frame comprises a second flange with a plurality of projections and a second extending portion extending from a top of the second flange toward internal space of the shielding frame so as to form a plate-like cover, and the plurality of projections are configured to be received in the through holes of the shielding frame.

12. The stacking structure of printed circuit board as claimed in claim 1, wherein the first shielding frame and the second shielding frame are made of metallic materials.

13. The stacking structure of printed circuit board as claimed in claim 1, wherein the first shielding frame and the second shielding frame are respectively formed on the first printed circuit board and the second printed circuit board via the surface mount technology technique.

14. A stacking structure of printed circuit board comprising:
- a first printed circuit board;
- a first shielding frame attached on the first printed circuit board;
- a second shielding frame being on the first shielding frame and being latched to the first shielding frame;
- a second printed circuit board being above the second shielding frame, the first shielding frame and the first printed circuit board; and
- at least one electronic component being disposed between the first and the second printed circuit board, and the first shielding frame and the second shielding frame together shielding the at least one electronic element therebetween.

* * * * *